United States Patent
Shoki et al.

(10) Patent No.: US 6,317,480 B1
(45) Date of Patent: Nov. 13, 2001

(54) METHOD OF MANUFACTURING X-RAY MASK AND X-RAY MASK BLANK, AND X-RAY MASK AND X-RAY MASK BLANK MANUFACTURED THEREBY

(75) Inventors: Tsutomu Shoki, Tokyo; Akinori Kurikawa, Yamanashi; Takamitsu Kawahara, Kanagawa; Ryo Ohkubo, Tokyo, all of (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/296,805

(22) Filed: Apr. 23, 1999

(30) Foreign Application Priority Data

Apr. 24, 1998 (JP) .................................................. 10-131151

(51) Int. Cl.[7] ............................. G03F 9/00; H01L 21/027
(52) U.S. Cl. .................................... 378/35; 378/34; 430/5
(58) Field of Search ............................. 378/35, 34; 430/5; 355/72, 74

(56) References Cited

U.S. PATENT DOCUMENTS

| | | | |
|---|---|---|---|
| 4,708,919 | 11/1987 | Shimkunas et al. | 378/34 |
| 4,890,309 | * 12/1989 | Smith et al. | 378/35 |
| 4,932,872 | * 6/1990 | Waggener | 430/5 |
| 5,112,707 | * 5/1992 | Kato et al. | 378/35 |

FOREIGN PATENT DOCUMENTS

| | | | |
|---|---|---|---|
| 60-251620 | 12/1985 | (JP) . | |
| 62-115720 | 5/1987 | (JP) . | |
| 4-53119 | 2/1992 | (JP) . | |
| 404053119A | * 2/1992 | (JP) | 378/35 |

* cited by examiner

*Primary Examiner*—Drew Dunn
(74) *Attorney, Agent, or Firm*—Varndell & Varndell, PLLC

(57) ABSTRACT

An X-ray mask including a mask support formed into the shape of a frame, an X-ray-transparent film which is supported so as to extend over the surface of the frame-shaped mask support and which permits transmission of X-rays, and a desired X-ray-absorbing film pattern laid on the X-ray-transparent film, wherein the mask support has a thickness which by itself affords sufficient mechanical strength; and a step is formed along the periphery of the mask support.

5 Claims, 5 Drawing Sheets

METHOD OF MANUFACTURING X-RAY MASK AND X-RAY MASK BLANK, AND X-RAY MASK AND X-RAY MASK BLANK MANUFACTURED THEREBY

BACKGROUND OF THE INVENTION

1. Field of the Invention

The present invention relates to a method of manufacturing an X-ray mask and an X-ray mask blank, as well as to an X-ray mask and an X-ray mask blank manufactured thereby.

2. Related Art of the Invention

In the semiconductor industry, photolithography—whereby a minute pattern is transferred while visible light or ultraviolet light is used as electromagnetic radiation for exposure purposes—has conventionally been employed as a technique for transferring a minute pattern required for forming an integrated circuit on a silicon substrate.

However, in conjunction with improvements in technology, significant advances have recently been made in the field of semiconductor devices, such as ULSIs, thereby requiring a transfer technology which permits transfer of a high-precision minute pattern exceeding the limit of transfer of the conventional photolithography that uses visible light or ultraviolet light.

To attain transfer of such a minute pattern, an X-ray lithography which uses an X-ray shorter in wavelength than visible light or ultraviolet light has been developed and put into actual use.

The X-ray lithography is proximal exposure of a pattern to X-ray at X1 magnification, and hence an X-ray mask having X1 magnification is required. FIG. 1 shows the structure of an X-ray mask used for X-ray lithography.

As shown in FIG. 1, the X-ray mask 1 comprises an X-ray-transparent film 12 for permitting transmission of X-rays, and an X-ray-absorbing pattern 13a for absorbing X-rays. The X-ray mask 1 is supported by a support frame 11a formed from a silicon substrate. Further, in order to facilitate reinforcement and handling of the X-ray mask 1, a glass frame 15 whose outer diameter is greater than that of the support frame 11a is cemented to the support frame 11a. For instance, a support frame having an outer diameter of 4 inches and a glass frame having an outer diameter of 5 inches are used.

FIG. 2 shows the structure of an X-ray mask blank used for manufacturing the aforementioned X-ray mask. The X-ray mask blank 2 comprises an X-ray-transparent film 12, an X-ray-absorbing film 13, and an etching mask layer 14, all of which are laid on the silicon substrate 11 in this sequence.

So-called X-ray mask blanks also comprise a mask blank, such as that shown in FIG. 3, in which silicon located at the center of a pattern area in the X-ray mask is removed from behind and the support frame 11a is attached to the reverse side of the mask blank such that the X-ray film 12 is self supporting; and a mask blank, such as that shown in FIG. 4, including the glass frame 15 bonded to the reverse side of the support frame 11a beforehand.

As shown in FIG. 5, the X-ray mask 1 and the resist-coated wafer 3 are fitted to a longitudinal X-ray stepper such that the X-ray mask 1 and the wafer 3 are closely spaced about 20 μm away from each other. After the X-ray mask 1 and the wafer 3 have been brought into alignment through use of alignment marks formed on both the X-ray mask 1 and the wafer 3, X-rays (synchrotron radiation in many cases) are radiated onto the wafer 3 byway of the X-ray mask 1, thereby sensitizing the resist that covers the wafer 3 and transferring a minute pattern onto the wafer 3.

In order to improve overlay accuracy between the X-ray mask 1 and the wafer 3 [including a tilt angle (i.e., an angle of rotation), in addition to alignment accuracy], accurate positional control of the X-ray mask 1 and individual corresponding stages the wafer 3 is required when they are secured on respective stages. To this end, as shown in FIG. 5, the X-ray mask 1, which is considerably heavier than the wafer 3, is correctly secured without distortion by chucking the glass frame 15 through use of a U-shaped handling arm 16. At the time of use of the handling arm 16, the portion of the handling arm 16 facing the X-ray mask 1 must be prevented from coming into contact with the surface of the wafer 3 during exposure. As a result of use of the X-ray mask 1 having the glass frame 15 shown in FIG. 5, the handling arm 16 chucks the glass frame 15, thereby preventing contact between the handling arm 16 and the surface of the wafer 3. The handling arm 16 facilitates transportation and holding of the X-ray mask 1 within the X-ray stepper.

The introduction phase of X-ray lithography has been delayed with recent progress in photolithography technology. At present, X-ray lithography is expected to be introduced into production of an X-ray mask used for manufacturing 1 GB-generation DRAM (having a line pitch of 0.18 μm as specified by the design rule). X-ray lithography is characterized in that, even when introduced into production of an X-ray mask used for manufacturing the 1 GB-generation DRAM, it can also be applied to production of an X-ray mask used for manufacturing 4 GB-generation DRAM, 16 GB-generation DRAM, and 64 GB-generation DRAM. Assuming that X-ray lithography is applied to preparation of an X-ray mask used for manufacturing 64 Gbit DRAM, required positional accuracy becomes more strict, and positional accuracy as great as 10 nm would be required. Consequently, there arises a requirement to minimize to substantially zero the distortion in the X-ray mask stemming from the processes for manufacturing the mask. In order to establish a system to mass-produce semiconductors by use of X-ray lithography, an X-ray mask must be periodically cleansed for the purpose of eliminating contaminants which become attached to the X-ray mask while the X-ray mask is in use. The X-ray mask subjected to proximal X-ray exposure is required to possess a high degree of flatness. For instance, the inside of the silicon substrate requires a flatness of 3 μm or less. Thus, there must be realized stable manufacture of X-ray masks having high positional accuracy and a high degree of flatness and allowing easy cleansing of the masks. In connection with cleansing of the X-ray mask, use of concentrated hot sulfuric acid or sulfuric acid-hydrogen preoxide mixture (a mixture of sulfuric acid and hydrogen preoxide) is said to be an effective cleansing method for removing contaminants such as organic substances.

An X-ray mask equipped with a reinforcement frame is usually manufactured by cementing the reinforcement frame to a support frame (i.e., a silicon substrate) of the X-ray mask through use of an adhesive such as epoxy. The adhesive is eluted during cleansing, thus contaminating the X-ray mask. Since cementing involves shrinkage of the adhesive, it is difficult to cement the reinforcement frame to the support frame while involving no warpage in the silicon substrate and ensuring good reproducibility. Consequently, a difficulty is encountered in stably manufacturing highly-accurate X-ray masks.

There may also be conceived another method, in which an X-ray mask is manufactured from only a silicon substrate without use of a frame. However, since the surface of the silicon substrate is flat, such an X-ray mask poses a problem when being transported and held by a handling arm within the X-ray stepper or when being handled outside the X-ray stepper.

SUMMARY OF THE INVENTION

The present invention has been conceived in view of the previously-described background, and a first object of the present invention is to provide an X-ray mask which is free from distortion, which would otherwise be caused by cementing a reinforcement frame to the X-ray mask; which has a considerably high degree of positional accuracy; which can be cleansed without involving contamination of the X-ray mask with an adhesive; and whose position can be correctly controlled while the X-ray mask is being secured on a stage within an X-ray stepper.

A second object of the present invention is to provide an X-ray mask manufacturing method which enables stable manufacture of a high-precision X-ray mask while ensuring good reproducibility.

A third object of the present invention is to provide an X-ray mask blank suitable for manufacturing the X-ray mask according to the present invention, as well as a manufacturing method therefor.

In order to achieve the objects, the present inventors have undertaken considerable studies, during the course of which they have found that a conventionally-used X-ray mask which is equipped with a reinforcement frame is effective for handling the X-ray mask within the X-ray stepper but cannot satisfy the required positional accuracy because of the distortion caused by bonding the reinforcement frame to the X-ray mask, thus rendering difficult the production of an X-ray mask used for manufacturing 1 GB DRAM or DRAM of a greater size. Further, the inventors have found that removal of the contaminants adhering to the X-ray mask during the cleansing process is difficult and hence the X-ray mask equipped with the reinforcement frame is not suitable for mass production.

Further, through additional studies, the inventors have also found that a step formed along the periphery of a thick silicon substrate eliminates the need for a reinforcement frame and facilitates securing and transportation of the X-ray frame within the X-ray stepper as well as handling of the X-ray frame outside the X-ray stepper, and that the structure of such an X-ray frame must inevitably be employed for producing an X-ray mask to be used for manufacturing 1 GB DRAM or DRAM of a greater size.

The present invention is embodied in the following configurations.

According to a first aspect of the present invention, there is provided an X-ray mask including a mask support formed into the shape of a frame, an X-ray-transparent film which is supported so as to extend over the surface of the frame-shaped mask support and which permits transmission of X-rays, and a desired X-ray-absorbing film pattern laid on the X-ray-transparent film, wherein the mask support has a thickness which by itself affords sufficient mechanical strength without the need for bonding to an additional support; and a step is formed along the periphery of the mask support.

Preferably, the mask support is formed from silicon and assumes a thickness of 1.5 to 8 mm.

Preferably, the thickness "t" between the surface of the mask support and the step surface accounts for 10% to 80% of the thickness T of the mask support.

According to a second aspect of the present invention, there is provided an X-ray mask blank used for producing any one of the previously-described X-ray masks, comprising:

a mask support formed into the shape of a frame;

an X-ray-transparent film which is supported so as to extend over the surface of the frame-shaped mask support and which permits transmission of X-rays; and an X-ray-absorbing film pattern laid on the X-ray-transparent film, wherein the mask support has a thickness which by itself affords sufficient mechanical strength; and a step is formed along the periphery of the mask support.

According to a third aspect of the present invention, there is provided an X-ray mask blank used for producing any one of the previously-described X-ray masks, comprising:

a mask support substrate; and an X-ray-transparent film formed over the surface of the mask support substrate;

an X-ray-absorbing film pattern formed on the X-ray-transparent film, wherein the mask support has a thickness which by itself affords sufficient mechanical strength without the need for bonding to an additional support, when the center of the mask support is cut so as to assume the shape of a frame; and a step is formed along the periphery of the mask support substrate.

According to a fourth aspect of the present invention, there is provided an X-ray mask substrate used for producing any one of the previously-described X-ray masks, comprising:

an X-ray-transparent film which is supported along the periphery of the X-ray mask substrate so as to extend over the surface thereof and which permits transmission of X-rays, wherein the mask support has a thickness which by itself affords sufficient mechanical strength; and a step is formed along the periphery of the mask support.

According to a fifth aspect of the present invention, there is provided an X-ray mask substrate used for producing any one of the previously-described X-ray masks, wherein the mask support has a thickness which by itself affords sufficient mechanical strength when the center of the mask support is cut so as to assume the shape of a frame; and a step is formed along the periphery of the mask support substrate.

According to a sixth aspect of the present invention, there is provided an X-ray mask blank manufacturing method including a step of forming an X-ray-transparent film on a mask support substrate;

a step of forming a frame-shaped mask support by removal of the center portion of the mask support substrate such that the X-ray-transparent film is supported over the removed portion of the mask support substrate; and a step of forming an X-ray-absorbing film on the X-ray-transparent film, wherein a substrate having a thickness which by itself affords sufficient mechanical strength when the center of the mask support is cut so as to assume the shape of a frame which is used as the mask support substrate; and the manufacturing method further comprises a step of forming a step along the periphery of the mask support substrate before or after the step of forming the X-ray-transparent film.

Preferably, the X-ray mask blank manufacturing method comprises a step of forming a step along the periphery of the mask support substrate through mechanical processing.

Preferably, the mechanical processing corresponds to laser processing.

According to a seventh aspect of the present invention, there is provided an X-ray mask manufacturing method employing any one of the previously-described X-ray mask blank manufacturing methods, comprising a step of patterning an X-ray-absorbing film.

According to the present invention, a step is formed along the periphery of the silicon substrate whose thickness enables the silicon substrate by itself to afford sufficient mechanical strength, thus eliminating a process for cementing a frame to the silicon substrate. As a result, there can be prevented distortion, which would otherwise be caused by cementing a frame to the silicon substrate, thus resulting in manufacture of a very high-precision X-ray mask.

The X-ray mask having the foregoing configuration can be readily cleansed to eliminate contaminants—which adhere to the mask during exposure or removal and attachment of the mask to a stepper—without involving contamination by an adhesive.

The X-ray mask having the foregoing configuration facilitates the holding and transportation of the X-ray mask by the handling arm within the X-ray stepper, as well as handling of the X-ray mask outside the X-ray stepper. Further, the X-ray mask enables correct positional control of the X-ray mask when the X-ray mask is secured on a stage within the X-ray stepper.

In connection with correct positional control, the X-ray mask is formed into an integrated structure without use of a frame, and a step is formed along the mask through laser processing, thereby improving parallelism between the bottom surface and the surface of the mask support as well as parallelism between the bottom surface of the mask support and the step surface. As a result, more accurate position control becomes feasible. Further, a handling arm can chuck the stepped X-ray mask according to the present invention without causing distortion (i.e., without distorting the X-ray-transparent film ), thereby improving transportation characteristics, stability, positional reproducibility, alignment accuracy, and throughput of the X-ray mask. Correct position control of the X-ray mask can be effected when the X-ray mask is secured on the stage of the X-ray stepper.

The present invention is suitable for producing an X-ray mask used for manufacturing 1 GB RAM or RAM of a greater size. Further, the present invention is suitable for producing an X-ray mask used for manufacturing 4 GB RAM (having a line pitch of 0.13 $\mu$m as specified by the design rule) or RAM of a greater size.

The present invention will be described in detail hereinbelow.

First, there will be given an explanation of an X-ray mask according to the present invention.

As shown in FIG. 6, the X-ray mask according to the present invention is characterized in that a frame-shaped mask support has a thickness T which by itself affords sufficient mechanical strength and that a step lid is formed along the periphery of the mask support.

The material of the mask support is not limited to any specific substance. However, in view of working properties, mechanical strength, chemical resistance, heat transfer characteristics, and electric conductivity, silicon is desirable.

The thickness T of the mask support is set to a thickness which by itself affords sufficient mechanical strength. More specifically, the thickness T assumes a value of 1.5 to 10 mm; preferably a value of 2 to 8 mm; more preferably a value of 4 to 8 mm; and further preferably a value of 6 to 8 mm. This is confirmed by referring to FIG. 9 shows a relation ship between the Si thickness and the Maximum deflection of the SiC X-ray transparent film in the case of using a 4-inch SiC X-ray transparent film with a window of 50 mm square. In the case that stress of the SiC X-ray transparent film is 200 Mpa, by making the thickness of the Si not more than 1.5 mm, maximum deflection not more than 10 $\mu$m can be obtained. The stress on of the SiC X-ray transparent film is preferably 100–200 Mpa. The reason is as follows. In the X-ray exposure process, semiconductor wafer and X-ray mask are come near each other so as to have a micro gap not more than 20 $\mu$m. Then X-ray mask is required to be moved step by step. When X-ray mask come near to the wafer is moved rapidly, the X-ray mask can be pressured owing to the flow of the air and X-ray transparent film is transformed by receiving the pressure. When X-ray mask whose X-ray transparent film is transformed is used for exposure step, exposing accuracy is deteriorated. And it takes for a long time that the transformed X-ray mask return to the original state, and through put is lowered. The amount of transformation has a relationship to the stress of the X-ray transparent film, and the film of which the stress is small, is easy to be transformed. It is pointed out that especially, small stress film not more than 100 Mpa has a problem to be easy to be transformed distinctly. On the other hand, the higher the stress, the transformation while moving is effectively prevented from transformation. However since the mechanical strength of the film being a high stress is lowered and the amount of the transformation increases, the stress is required to be not more than 200 Mpa. Further, the maximum deflection of the X-ray transparent film is required to be not more than 10 $\mu$m so as to prevent a stress caused by mounting the X-ray mask to the stepper and realize the nearer exposure process. Further the maximum value of the substrate thickness is required not to excess the practical thickness as the X-ray mask. Here, a desirable thickness may vary according to the outer diameter and profile of the mask support.

No specific limitation is placed on the size of the mask support. In the case of a circular mask support, although a current standard circular mask support has an outer diameter of 5 inches, a mask support having an outer diameter of 4 inches or 6 inches may be used according to the size of the X-ray stepper. Further, the mask support may assume an angular form.

The thickness "t" between the surface of the X-ray mask and the step surface may also change according to the thickness of the mask support. If the mask support has a thickness of 2 mm or greater, it is desirable to set the thickness "t" is set to 10 to 80% the thickness T of the mask support, in view of dimensional limitations on the handling arm, machining accuracy of a silicon substrate, and strength of the step. Further, desirably the thickness "t" of the step is set to a value equal to thickness T minus 0.5 mm when thickness T is greater than 0.5 mm, more preferably a value equal to the thickness T minus 1 mm when thickness T is greater than 1 mm.

The step may be located at any position outside the mask area, and the width (or length) of the step preferably assumes a value of about 3 mm to 30 mm. In the case of the X-ray mask having an outer diameter of 5 inches, desirably a step is formed in, e.g., the area between the point spaced at least 70 mm away from the mask area and the point spaced 5 mm away from the outer diameter.

An X-ray mask blank according to the present invention will now be described.

The X-ray mask blank according to the present invention is characterized in that the mask support has a thickness which by itself affords sufficient mechanical strength and in that a step is formed along the periphery of the mask support.

The X-ray mask blank comprises an X-ray mask blank in which silicon located at the center of the X-ray mask, which is to serve as a pattern area, is removed from behind to thereby form a support frame such that an X-ray-transparent is self supporting; and an X-ray mask blank in which the support frame has not yet been formed. Further, the present invention comprises an X-ray mask blank in which an X-ray-absorbing film has not yet been formed (i.e., an X-ray mask substrate), and an X-ray mask blank in which neither the X-ray-transparent film nor the X-ray-absorbing film has been formed yet (i.e., a mask support substrate).

Each of the X-ray mask and the X-ray mask blank according to the present invention comprises at least an X-ray-transparent film for permitting transmission of X-rays, and an X-ray-absorbing film pattern or an X-ray-absorbing film formed on the X-ray-transparent film.

Another layer (or film) other than the X-ray-transparent film and the X-ray-absorbing film may be provided, as required. For instance, an etch stopper layer, a contact layer, an antireflection layer, and a conductive layer may also be interposed between the X-ray-transparent film and the X-ray-absorbing film. Further, an etching mask layer, a protective layer, and a conductive layer may be provided on the X-ray-absorbing film.

The positional distortion of the X-ray mask is strongly affected by the stress imposed on the material of the X-ray mask. If the X-ray-absorbing film, the etch mask film, and the etch stopper layer are subjected to great stress, the positional distortion of the X-ray mask is induced by the stress. Thus, individual films constituting the X-ray mask are required to be subjected to considerably low stress.

In the present invention, the material of the X-ray-transparent film may include SiC, SiN, and a diamond thin film. However, from the viewpoint of durability to irradiation with X-rays, SiC is desirable.

Desirably the X-ray-transparent film is subjected to stress of 50 to 400 Mpa or less. Further, desirably the X-ray-transparent film has a thickness of about 1 to 3 $\mu$m.

The material of the X-ray-absorbing film comprises a material including, as a primary component, metal having a high fusing point such as tantalum (Ta) or tungsten (W). More specifically, the material comprises a compound formed from Ta and B [e.g., $Ta_4B$ (Ta:B=8:2) or tantalum boride whose composition is other than $Ta_4B$], metal Ta, Ta-containing amorphous material, Ta-based material containing Ta and other substances, metal W, and W-based material containing W and other substances. From the viewpoint of durability to irradiation with X-rays, material comprising tantalum as a primary component is desirable.

The X-ray-absorbing material comprising tantalum as a primary component desirably has an amorphous or microcrystal structure. The reason for this is that the X-ray-absorbing material having a crystalline (or columnar) structure is difficult to process and is inferior in terms of durability to irradiation with X-rays and time-varying stability.

Desirably, the X-ray-absorbing film material comprising tantalum as a primary component further contains at least B in addition to Ta. The reason for this is that an X-ray-absorbing film containing both Ta and B has advantages of low internal stress, has a high degree of purity, contains no impurities, and has a great X-ray absorption factor. Further, the internal stress of such an X-ray-absorbing film can be readily controlled by controlling the pressure of the gas that is used for growing an X-ray-absorbing film through sputtering.

The content of B included in the X-ray-absorbing film comprising Ta and B is desirably set to a range of 15 to 25 atomic weight percentages. If the content of B included in the X-ray-absorbing film exceeds this range, the grain size of microcrystal becomes great, thereby rendering difficult micro-processing of microcrystal on the order of submicrons (described in Japanese Patent Laid-open No. Hei-2-192116).

Desirably, the X-ray-absorbing film is subjected to stress of 10 Mpa or less and has a film thickness of about 0.3 to 0.8 $\mu$m.

The etching mask layer formed in the X-ray mask blank may be formed from material comprising chromium as a primary component. More specifically, an etching mask comprising chromium, carbon, and/or nitrogen maintains a high etch selectivity with respect to the X-ray-absorbing film and provides only considerably low film stress.

Desirably, the etching mask has a thickness of about 0.03 to 0.1 $\mu$m. The product of stress and film thickness of the etching mask layer is preferably lower than a range of $\pm 1 \times 10^4$ dyn/cm. If the product of stress and film thickness exceeds the range, positional distortion due to stress becomes greater, thereby rendering manufacture of a very high-precision X-ray mask impossible.

A method of manufacturing an X-ray mask blank according to the present invention will now be described.

The X-ray mask blank manufacturing method is characterized in that a stepped silicon substrate is produced through mechanical machining.

In this case, from the viewpoint of machining accuracy, the mechanical machining preferably corresponds to laser processing. Here, dry etching or wet etching may also be employed as mechanical machining. Since the depth to be etched is great, variations (evenness) in the thickness of the step formed by etching become worse, making etching unsuitable for forming the step. Preferably, variations in the thickness of the step are ±0.1 mm.

Preferably, the center portion of the mask support is removed from behind, by wet etching, to thereby form a support frame such that the X-ray-transparent film is self-supporting. In this case, a mixture of hydrofluoric acid and nitric acid or KOH may be used as an etchant. Etching conditions may be adjusted, as required.

Other processing steps of the X-ray mask blank manufacturing method are not particularly limited, and a conventionally-known X-ray mask blank manufacturing method may be applied to manufacture of the X-ray mask blank according to the present invention.

A method of manufacturing an X-ray mask according to the present invention will now be described.

Under the X-ray mask manufacturing method according to the present invention, the X-ray-absorbing film formed on the X-ray-transparent film of the previously-described X-ray mask blank is patterned to thereby form an X-ray mask.

The manufacturing processes of the X-ray mask are not limited particularly, and a conventionally-known X-ray mask manufacturing processes may be applied to manufacture of the X-ray mask according to the present invention.

For instance, during patterning of the etching mask layer, an electron beam resist is formed on the etching mask layer, and a known patterning technique, such as electron beam lithography (writing, development, rinsing, drying, etc.) may be used. Preferably, the electron resist assumes a thickness of 50 to 500 nm.

Preferably, a mixed gas comprising chlorine and oxygen is used as etchant for dry-etching the etching mask while the resist pattern is used as a mask.

Preferably, chlorine is used as etchant for dry-etching the X-ray-absorbing film while the resist pattern is used as a mask.

A reactive ion etching (RIE) system and a reactive ion beam etching (RIBE) system which uses a high-density plasma source such as ECR or ICP may be used as a dry-etching system. invention.

PREFERRED EMBODIMENTS OF THE INVENTION

The present invention will be described in more detail by reference to preferred embodiments.
First Embodiment FIGS. 7A to 7F are schematic representations for describing the process for manufacturing an X-ray mask according to a first embodiment of the present invention. The method of manufacturing the X-ray mask according to the first embodiment will now be described by reference to FIGS. 7A to 7F.

Figure 1:
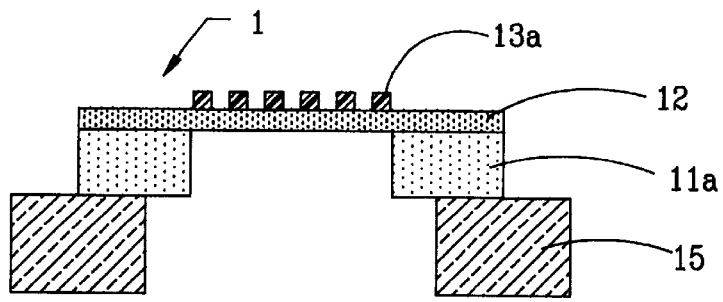
FIG. 1 is a cross-sectional view for describing the structure of a conventional X-ray mask and a frame.
Figure 2:
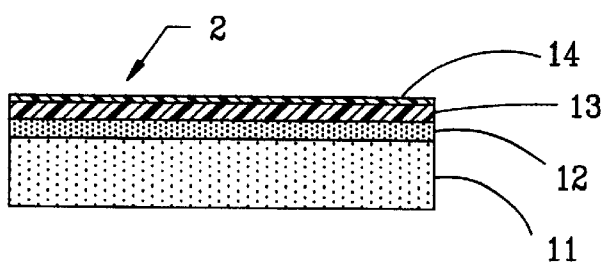
FIG. 2 is a cross-sectional view for describing the structure of a conventional X-ray mask blank.
Figure 3:
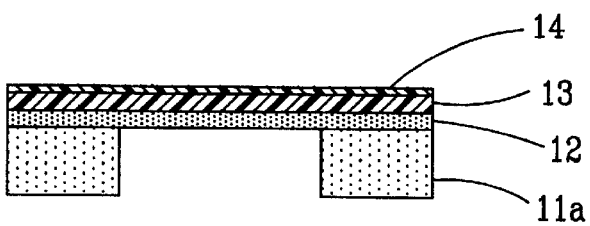
FIG. 3 is a cross-sectional view for describing the conventional X-ray mask blank according to another embodiment.
Figure 4:
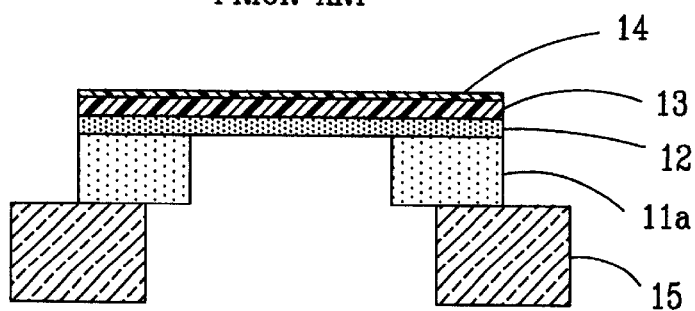
FIG. 4 is a cross-sectional view for describing the conventional X-ray mask blank according to still another embodiment.
Figure 5:
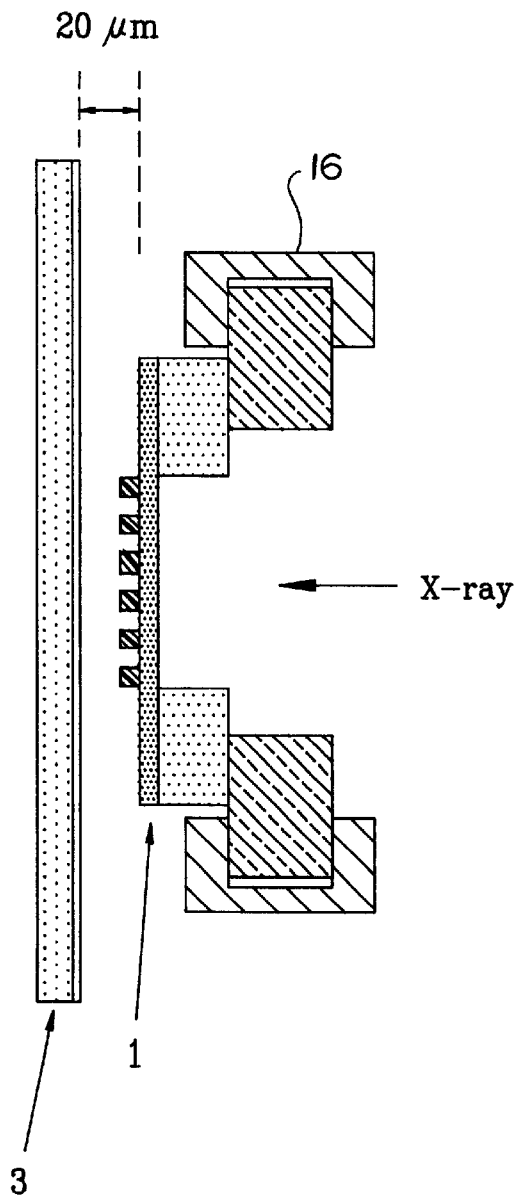
FIG. 5 is a cross-sectional view for describing transfer of a pattern on a wafer by way of the conventional X-ray mask.
Figure 6:
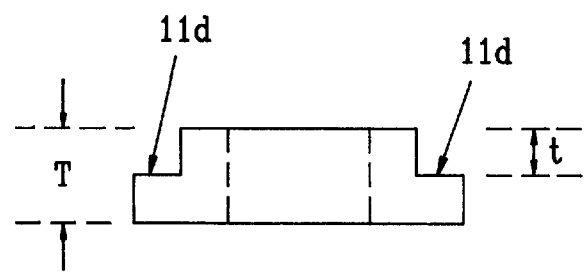
FIG. 6 is a cross-sectional view for describing the thickness of a step formed in the X-ray mask.
Figure 7A:
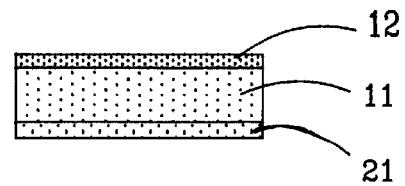
FIGS. 7A to 7F are cross-sectional views showing the process for manufacturing the X-ray mask blank according to one embodiment.

Silicon carbide films are grown on both sides of a silicon (Si) substrate 11 as X-ray-transparent films 12 and 21 (FIG. 7A). A flat silicon substrate having a diameter of 5 inches, a thickness of 7.63 mm, and crystal orientation (100) is used as the silicon substrate 11. Through chemical vapor deposition, silicon carbide used as the X-ray-transparent film 12 is grown to a thickness of 2 $\mu$m by use of dichlorosilane and acetylene. Further, the surface of silicon carbide serving as the X-ray-transparent film 12 is smoothed through mechanical abrasion to thereby assume a surface roughness of Ra=1 nm or less.

Figure 7B:
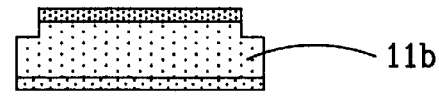

The outer 12.5 mm of the substrate is abraded to a depth of 2 mm through mechanical machining, thereby forming a stepped silicon substrate 11b (FIG. 7B).

Figure 7C:
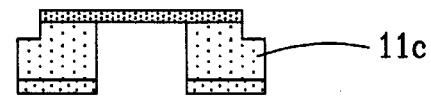

A square area which measures 30 mm and is located at the center of the X-ray-transparent film 21 formed on the other side of the substrate 11b (i.e., the reverse side of the substrate 11b) is removed through reactive ion etching employing a mixed gas comprising $CF_4$ and oxygen gas. The substrate 11b is immersed in a mixture comprising hydrofluoric acid and nitric acid (10:1) while the X-ray-transparent film 21 still remaining on the reverse side of the substrate 11b is used as a mask, thereby removing the center portion of the silicon substrate. As a result, there is formed a mask film 11c having the square X-ray-transparent film 12 which measures 30 mm and is self supporting (FIG. 7C). FIG. 7F is a top view of the mask film 11c.

Figure 7D:
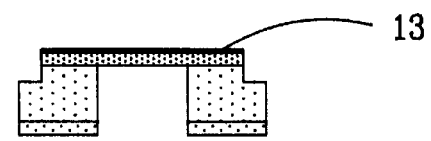

An X-ray-absorbing film 13 comprising tantalum and boron is formed on the X-ray-transparent film 12 to a thickness of 0. 5 $\mu$m by means of the DC magnetron sputtering method (FIG. 7D). The stress imposed on the film is measured as −150 MPa through use of the bulging method. Subsequently, the silicon substrate 11c on which the X-ray-absorbing film 12 is formed is annealed for 2 hrs. at 280° C. in the atmosphere, thereby changing the stress of the film 12 to the direction of withdraw. As a result, there is produced an X-ray-absorbing film subjected to stress of 10 MPa or less.

Figure 7E:
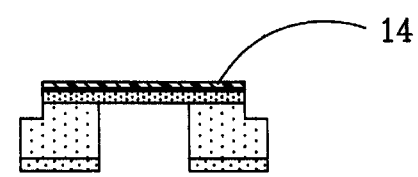
Figure 7F:
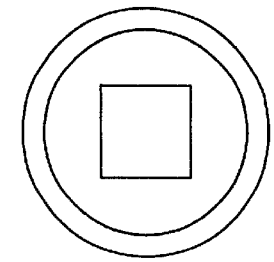

A film comprising chromium and nitrogen is formed on the X-ray-absorbing film as the etching mask layer 14 to a thickness of 0.05 $\mu$m by means of the DC magnetron sputtering method. Subsequently, the substrate is annealed at 230° C. for two hours, thus producing an etching mask layer subjected to stress of 100 MPa or less (FIG. 7E). At this time, the stress imposed on the etching mask layer 14 is measured by the bulging method.

Through use of the thus-formed X-ray mask blank, there is produced an X-ray mask on which is formed a pattern to be used for manufacturing 1 Gbit RAM (having a line pitch of 0.18 $\mu$m as specified by the design rule). The positional distortion of the mask is evaluated by the coordinate measuring machine, so that the mask is ascertained to have a positional accuracy satisfying a required positional accuracy of 22 nm (3σ).

It is ascertained that the X-ray mask can be readily cleansed by acid such as concentrated hot sulfuric acid or sulfuric acid-hydrogen preoxide mixture and that contaminants can be effectively removed from the X-ray mask.
Second Embodiment FIGS. 8A to 8F show a method of manufacturing an X-ray mask blank according to a second embodiment of the present invention.

A stepped silicon substrate 11b (FIG. 8A) is formed from the silicon substrate 11b having a diameter of 5 inches and a thickness of 7.63 mm by machining, such that a 4-inch or greater diameter step is formed to a depth of 5.63 mm. Silicon having crystal orientation (100) is used for the silicon substrate.

Figure 8A:
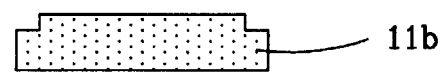
FIGS. 8A to 8F are cross-sectional views showing the process of manufacturing an X-ray mask blank according to another embodiment.
Figure 8B:
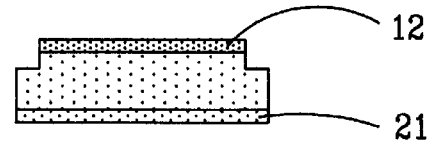

Next, the X-ray-transparent films 12 and 21 are grown on respective sides of the substrate 11b (FIG. 8B). Through chemical vapor deposition, silicon carbide used as the X-ray-transparent film 12 is grown by use of dichlorosilane and acetylene to a thickness of 2 $\mu$m. Further, the surface of the center of silicon carbide serving as the X-ray-transparent film 12 is smoothed through mechanical abrasion to thereby assume a surface roughness of Ra=1 nm or less.

Figure 8C:
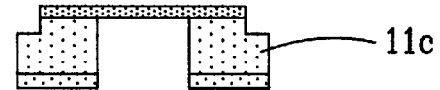
Figure 8D:
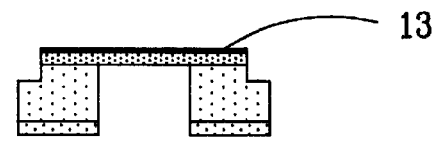
Figure 8E:
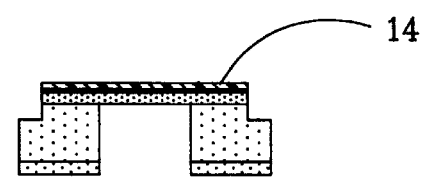
Figure 8F:
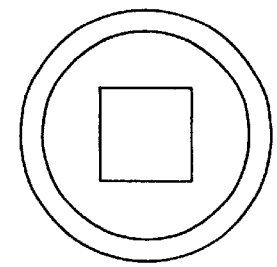
Figure 9:
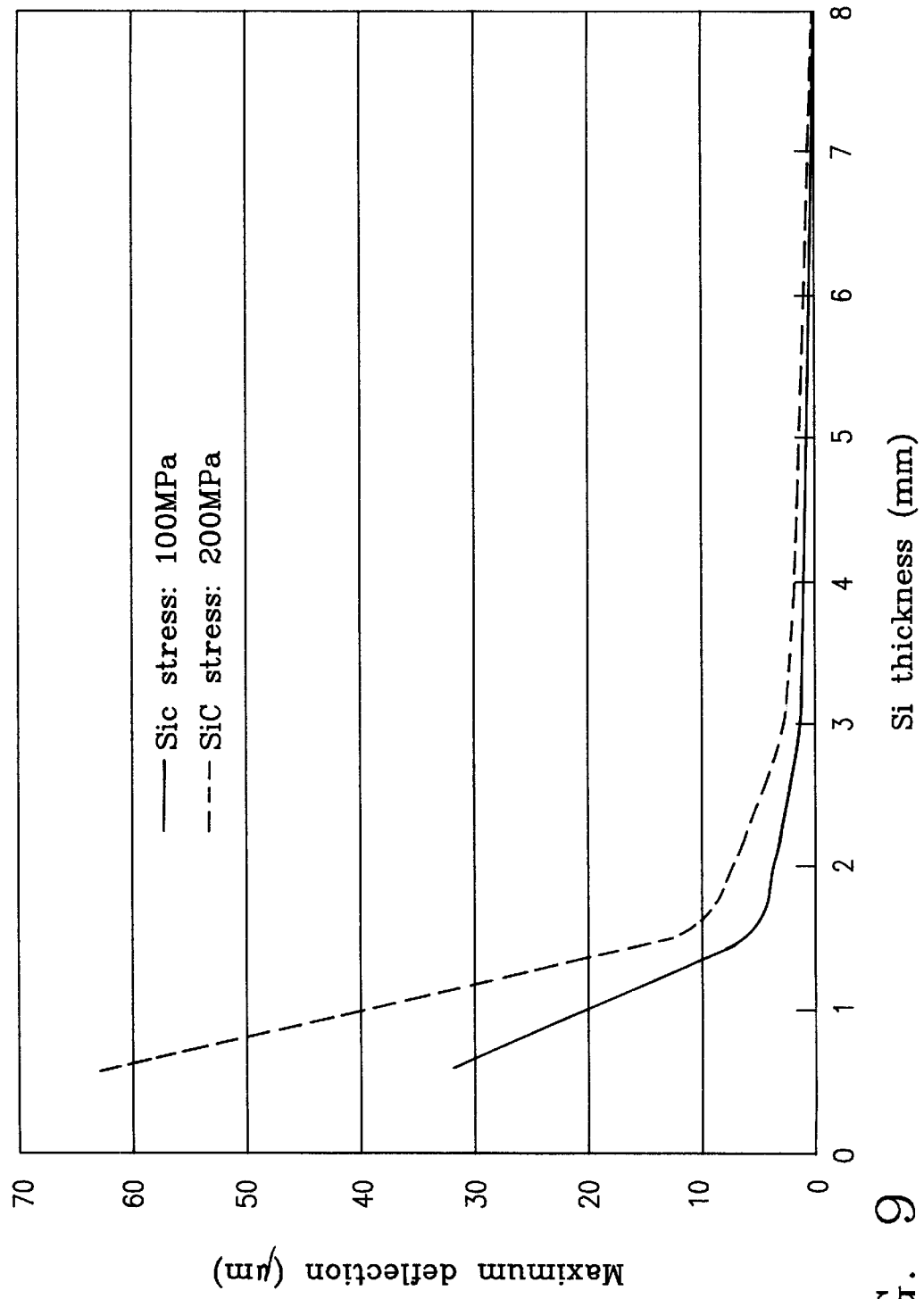
FIG. 9 shows a relationship between Si thickness and Maximum deflection.

A square area which measures 30 mm and is located at the center of the X-ray-transparent film 21 formed on the other side of the substrate 11b (i.e., the reverse side of the substrate 11b) is removed through reactive ion etching employing a mixed gas comprising $CF_4$ and oxygen gas. The substrate 11b is immersed in a mixture comprising hydrofluoric acid and nitric acid while the X-ray-transparent film 21 still remaining on the reverse side of the substrate 11b is used as a mask, thereby removing the center portion of the silicon substrate. As a result, there is formed a mask film 11c having the square X-ray-transparent film 12 which measures 30 mm and is self supporting (FIG. 8C). FIG. 8F is a top view of the mask film 11c.

An X-ray-absorbing film 13 comprising tantalum and boron is formed on the X-ray-transparent film 12 to a thickness of 0.5 μm by means of the DC magnetron sputtering method (FIG. 7D). The stress imposed on the film is measured as −150 MPa through use of the bulging method. Subsequently, the silicon substrate 11c on which the X-ray-absorbing film 12 is formed is annealed for 2 hrs. at 280° C. in the atmosphere, thereby changing the stress imposed on the film 12 to the direction of withdrawal. As a result, there is produced an X-ray-absorbing film subjected to stress of 10 MPa or less.

By means of the DC magnetron sputtering method, a film comprising chromium and nitrogen is formed on the X-ray-absorbing film as the etching mask layer 14 to a thickness of 0.05 μm. Subsequently, the substrate is annealed at 230° C. for two hours, thus producing an etching mask layer subjected to stress of 100 MPa or less (FIG. 8E).

Through use of the thus-formed X-ray mask blank, there is produced an X-ray mask on which is formed a pattern to be used for manufacturing 1 GB RAM (having a line pitch of 0.18 μm according to the design rule). The positional distortion of the mask is evaluated by the coordinate measuring machine, and the mask is ascertained to have a positional accuracy satisfying a required positional accuracy of 22 nm (3σ).

It is ascertained that the X-ray mask can be readily cleansed by acid such as concentrated hot sulfuric acid or sulfuric acid-hydrogen preoxide mixture and that contaminants can be effectively removed from the X-ray mask.

Although the present invention has been described by reference to the preferred embodiments, the present invention is not limited to these embodiments.

For example, the reverse side of the silicon substrate may be processed after growth of the X-ray-transparent film and/or the X-ray-absorbing film. Similarly, a step may be formed along the periphery of the silicon substrate after growth of the X-ray-absorbing film.

In addition to crystal orientation (100), the silicon substrate may assume crystal orientation (110) or (111).

Silicon nitride or a diamond film may also be used as the X-ray-transparent film in place of silicon carbide.

Tantalum boride whose composition is other than $Ta_4B$, metal Ta, and a composition containing Ta may also be used as the X-ray-absorbing film.

Further, alumina ($Al_2O_3$) or a $SiO_2$ film may also be used as the etching mask layer in place of a chromium compound.

As has been described above, according to the present invention, a step is formed along the periphery of the silicon substrate whose thickness enables the silicon substrate by itself to afford sufficient mechanical strength, thus eliminating a process for cementing a frame to the silicon substrate. As a result, there can be prevented distortion, which would otherwise be caused by cementing a frame to the silicon substrate, thus resulting in manufacture of a very high-precision X-ray mask.

The X-ray mask having the foregoing configuration can be readily cleansed to eliminate contaminants—which adhere to the mask during exposure or removal and attachment of the mask to a stepper—without involving contamination by an adhesive.

Further, the X-ray mask having the foregoing configuration facilitates the holding and transportation of the X-ray mask by the handling arm within the X-ray stepper, as well as handling of the X-ray mask outside the X-ray stepper. Further, the X-ray mask enables correct positional control of the X-ray mask when the X-ray mask is secured on a stage within the X-ray stepper.

The X-ray mask manufacturing method according to the present invention enables stable manufacture of a high-precision mask with good reproducibility.

The X-ray mask blank according to the present invention and the manufacturing method therefor are suitable for manufacturing the X-ray mask according to the present

What is claimed is:

1. An X-ray mask comprising:
    a mask support having a thickness of 1.5 to 8 mm and formed into the shape of a frame surrounding an opening, a step formed along a periphery of the opening in the mask support;
    an X-ray-transparent film being supported on the step of the mask support and extending across the opening of the mask support and permitting transmission of X-rays; and
    an X-ray-absorbing film pattern on the X-ray-transparent film.

2. The X-ray mask according to claim 1, wherein the mask support is formed from silicon.

3. The X-ray mask according to claim 1, wherein the thickness "t" between the surface of the mask support and the step surface accounts for 10% to 80% of the thickness T of the mask support.

4. An X-ray mask blank used for producing an X-ray mask, comprising:
    a mask support having a thickness of 1.5 to 8 mm and formed into the shape of a frame surrounding an opening, a step formed along a periphery of the opening in the mask support;
    an X-ray-transparent film being supported on the step of the mask support and extending across the opening of the mask support and permitting transmission of X-rays; and
    an X-ray-absorbing film on the X-ray-transparent film.

5. An X-ray mask blank used for producing an X-ray mask comprising:
    a mask support substrate having a thickness of 1.5 to 8 mm and having a step formed along the periphery of the mask support substrate; and
    an X-ray-transparent film formed over the surface of the mask support substrate.

* * * * *